United States Patent [19]

Slobodnik et al.

[11] Patent Number: 4,489,289

[45] Date of Patent: Dec. 18, 1984

[54] SAW OSCILLATOR WITH DIGITAL COMPENSATION FOR TEMPERATURE RELATED FREQUENCY CHANGES

[75] Inventors: Andrew J. Slobodnik, Malden, Mass.; Roger D. Colvin, Dayton, Ohio

[73] Assignee: The United States of America as represented by the Secretary of the Air Force, Washington, D.C.

[21] Appl. No.: 366,746

[22] Filed: Apr. 8, 1982

[51] Int. Cl.³ .................. H03H 9/25; H03B 5/32; H03L 1/02

[52] U.S. Cl. .................. 331/107 A; 331/176; 333/155; 310/313 A

[58] Field of Search ........... 310/313 A, 313 B, 313 R; 331/66, 107 A, 176; 333/155

[56] References Cited

U.S. PATENT DOCUMENTS

| | | | |
|---|---|---|---|
| 3,886,484 | 5/1975 | Dias et al. | 331/107 A |
| 3,889,205 | 6/1975 | Mitchell | 331/41 |
| 4,193,045 | 3/1980 | Houkawa et al. | 331/107 A |
| 4,272,742 | 6/1981 | Lewis | 333/155 |

FOREIGN PATENT DOCUMENTS

| | | | |
|---|---|---|---|
| 154805 | 12/1980 | Japan | 331/107 A |
| 52905 | 5/1981 | Japan | 331/1 R |

OTHER PUBLICATIONS

A Miniature High Stability TCSO Using Digital Compensation, Mroch and Hykes, Proc. Frequency Control Symposium, 1976.
Temperature Compensation of Crystals with Parabolic Temperature Coefficients, Kinsman, Proc. Freq. Control Symposium, 1978.
The Frequency Shifting Synthesizer, Warwick, Prescott and Gosling, The Radio and Electronic Engineer, 1980.
Dual Mode Operation of Temperature and Stress Compensated Crystals, Kusters, Fischer and Leach, Proc. Frequency Control Symposium, 1978.
A SAW Temperature Compensated Oscillator Using the Difference Between Metallized and Free Delay Temperature Coefficients on LITAO3, Henaff and Feldman, Ultrasonics Symposium Proceedings, 1978.

*Primary Examiner*—Eugene R. LaRoche
*Assistant Examiner*—W. R. Paxman
*Attorney, Agent, or Firm*—Donald J. Singer; Willard R. Matthews

[57] ABSTRACT

The inherent temperature instability of surface acoustic wave (SAW) clock oscillators is improved by the use of a thermometer oscillator circuit that senses temperature changes in the SAW substrate. The thermometer oscillator is used in combination with a calibrated programmable read only memory and a logic circuit and provides frequency corrections to the clock oscillator. The basic device is an oscillator clock circuit using a SAW substrate having a delay path orientation with good temperature stability. A second oscillator, the thermometer oscillator circuit, and the electronic compensation scheme are added in order to produce minimum temperature coefficient of delay over all temperatures in the range of interest. The thermometer oscillator delay path utilizes a high temperature coefficient of delay orientation of the same SAW substrate and at an appropriate angle to the clock oscillator delay path orientation. Its frequency of oscillation is used as a highly accurate thermometer in order to control a correction signal applied to a variable phase shifter in the clock oscillator loop.

15 Claims, 11 Drawing Figures

SAW OSCILLATOR WITH DIGITAL COMPENSATION FOR TEMPERATURE RELATED FREQUENCY CHANGES

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave (SAW) oscillators and in particular to digital compensation for temperature related frequency changes in such devices.

The generation of precise frequencies by means of crystal controlled oscillators is an important electronics function. Recently, SAW oscillators have shown themselves to be a particularly cost effective implementation of this function. The SAW oscillator generally comprises a SAW substrate having input and output transducers on its surface acoustic wave propagating surface. The transducers are positioned to provide a delay path that coincides with a low temperature coefficient of delay orientation. An amplifier connected between the input and output transducers completes, and provides power for, the oscillator circuit.

The two main advantages of SAW devices over traditional bulk crystals are: (1) photolithographic fabrication on a single surface which is applicable to mass production, and (2) straightforward realization of devices operating directly at frequencies of 100–2000 MHz without the multipliers and filters necessary with bulk devices.

A problem associated with the generation of precise frequencies which is shared by both bulk and SAW devices as well as other crystal controlled oscillators is maintaining frequency stability over a wide temperature range. That is, it is desirable to overcome the inherent temperature sensitivity in the crystal element which results in a variation of the frequency of oscillation with temperature.

In the past ovens have been used to maintain the oscillator at a constant temperature. This however adds significantly to the complexity, power requirements, cost and weight of the system in which the oscillator is used. The warm up time required to get the system operational in adverse climates and the additional weight of the oven makes this solution undesirable for many military and airborne applications.

Various other techniques have been proposed to compensate for the temperature sensitivity of SAW oscillators. None of these techniques are capable of very precise compensation, however. In general, many systems require better performance than is possible with the state-of-the-art approach and finer control of the compensation is desired.

Although some improvement is achieved by precise delay path orientation and carefully controlled fabrication processes, the concomitant increase in manufacturing expense and delay times is objectionable.

Accordingly there currently exists the need for a simple, inexpensive and effective means for providing SAW oscillator temperature compensation. The present invention is directed toward satisfying that need.

SUMMARY OF THE INVENTION

The invention is a frequency stable digitally compensated SAW oscillator. The SAW oscillator substrate has two input-output transducer pairs on its surface acoustic wave propagation surface. One pair is used in the clock oscillator circuit and defines a delay path that coincides with a low temperature coefficient of delay orientation. A low (or other specified value) temperature coefficient of delay orientation refers to a crystalographic cut such that when a SAW device is fabricated using that cut the temperature coefficient of delay of the device is low (or some specified value). It refers to a cut having at least one zero slope in its frequency shift versus temperature characteristic as is illustrated by curve 81 of FIG. 10. The other transducer pair is used in a thermometer oscillator circuit and defines a delay path that coincides with a high temperature coefficient of delay orientation. The clock oscillator circuit includes an amplifier and a phase shifter. The thermometer circuit includes only an amplifier and its output signal is counted. The signal frequency, and hence its count varies with substrate temperature and provides a precise thermometer reading. The substrate is calibrated over the temperature range of interest and a programmable read-only memory is programmed with the calibration data. A logic circuit provides for addressing the programmable read only memory with the thermometer oscillator signal count and for reading out correction words stored in the memory to control the clock oscillator phase shifter and thus appropriately adjust the clock frequency.

In a preferred embodiment the substrate is ST or AT cut quartz, the clock and thermometer delay paths cross, and the clock circuit delay path has at least one zero temperature coefficient of delay within the oscillator's temperature range of interest.

It is a principal object of the invention to provide a new and improved frequency stable SAW oscillator.

It is another object of the invention to provide a frequency stable SAW oscillator that does not require a thermally controlled environment.

It is another object of the invention to provide a frequency stable SAW oscillator that is capable of precise frequency compensation.

It is another object of the invention to provide a frequency stable SAW oscillator having simple, inexpensive and effective temperature compensation.

These together with other objects features and advantages of the invention will become more readily apparent from the following detailed description taken in conjunction with the illustrative embodiments in the accompanying drawings wherein like elements are given like reference characters throughout.

DETAILED DESCRIPTION OF THE PREFERRED EMBODIMENT

Figure 1:
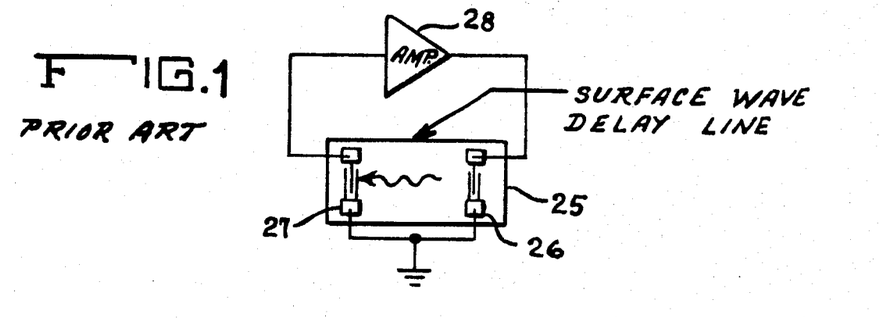
FIG. 1 is a schematic diagram of a basic SAW delay line oscillator.

A conventional basic SAW delay line oscillator is illustrated schematically in FIG. 1. It comprises substrate 25, input and output transducers 26, 27 and feedback loop amplifier 28. As noted above, it has been difficult to maintain frequency stability over a wide temperature range with these devices. The present invention is a digitally compensated SAW oscillator (DCSO) that overcomes this problem.

The key feature of the invention is the use of two delay paths on each SAW substrate. The first path is aligned with a SAW orientation having traditional low temperature sensitivity properties; that is, an orientation having at least one zero temperature coefficient of delay within the temperature range of interest. By means of oscillation around a feedback loop, this device provides the precise frequency or clock. Ordinary SAW oscillators of the type illustrated in FIG. 1 utilize only this single clock path. However, in the present system the standard clock orientation is only the starting point. A second delay path generally criss-crossing the first is used and electronics are added with the result of improving the inherent temperature stability properties of the clock orientation alone.

The second delay is aligned with a SAW orientation having high temperature sensitivity and acts, through its frequency of oscillation, as a thermometer or temperature measuring device. By using a thermometer placed directly on the same substrate as the clock, thermal contact and time constant problems are minimized and extremely accurate temperature sensing is possible.

Figure 2:
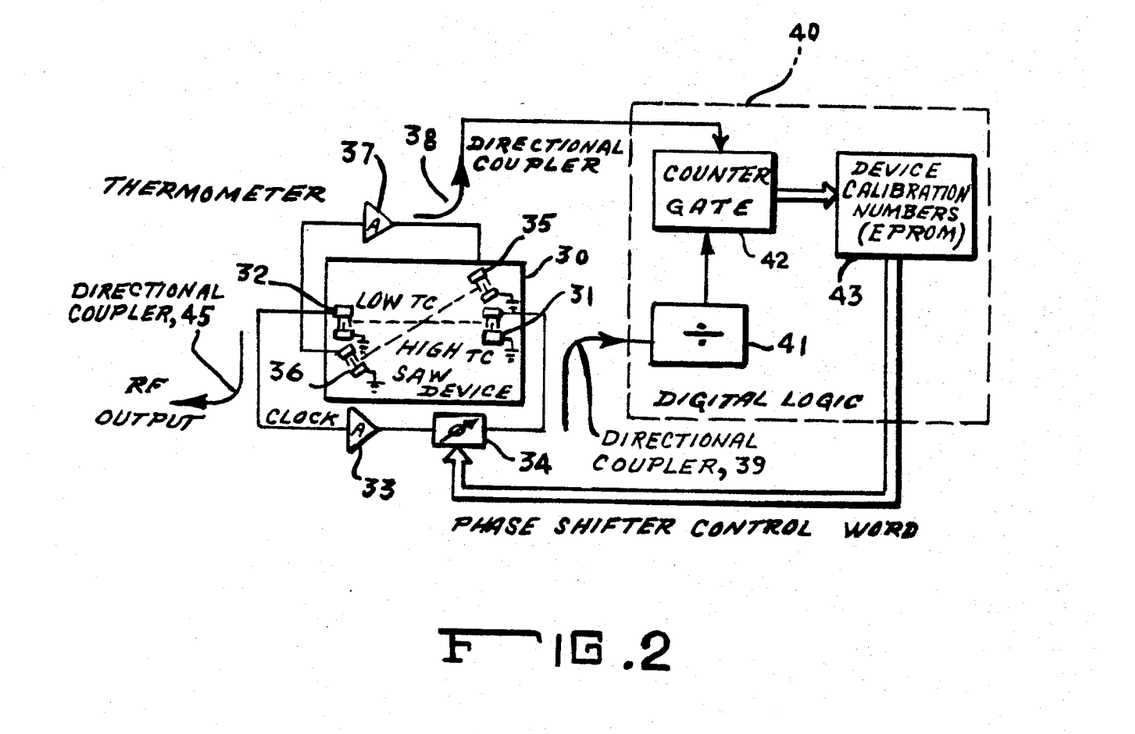
FIG. 2 is a simplified block diagram of the digitally compensated SAW oscillator of the invention.

One presently preferred embodiment of the digitally compensated SAW oscillator of the invention is illustrated schematically in FIG. 2. It comprises SAW substrate member 30, a clock circuit consisting of transducers 31, 32, amplifier 33, and phase shifter 34, a thermometer circuit consisting of transducers 35, 36 and amplifier 37, and digital logic 40 including counter 42, divider means 41 and device calibration means 43. Digital logic is coupled to the clock circuit and the thermometer circuit by means of couplers 39, 38. The clock output is obtained by means of coupler 45. In operation, the output of a digital counter 42 operating on the thermometer frequency provides a count which is a direct measure of temperature. This count is fed to a precalibrated (electrically) (erasable) (programmable) read only memory (EEPROM, EPROM, PROM or ROM) in device calibration means 43. At each temperature the phase shifter control word necessary to maintain a stable clock frequency is applied by the PROM to the electronically variable phase shifter 43. Since the clock frequency is always precisely maintained, it can be used to provide a constant duration gate to the counter. System convergence is assured due to the intentional difference in temperature coefficients of the two delay paths.

The simplicity of the system is a feature of the invention. The clock frequency itself is directly available as an output and no further manipulation or frequency synthesis is required.

Major advantages of this scheme include optimum temperature sensing, very fast warmup and low cost.

In order to successfully implement a DCSO device, a SAW substrate having specific properties is required. Orientations appropriate to both a clock delay path and a thermometer delay path must exist at an appropriate angle to each other. The angle should be sufficiently small such that the criss-crossed delay paths are as close together as possible without transducer overlap. This minimizes thermal differences between the clock path and the thermometer.

In addition, the clock orientation and the thermometer orientation should each possess the following desired properties. Both should have reasonable coupling constants for conversion of electromagnetic to acoustic energy. Although not essential, it is helpful if both have zero power flow angles, that is, are pure mode axes. The clock orientation should possess, at a minimum, a zero first order temperature coefficient of delay within the temperature range of interest. The thermometer orientation should possess as high a temperature coefficient of delay as possible in order to maximize its sensitivity to temperature changes and insure rapid convergence of the feedback loop.

Figure 3:
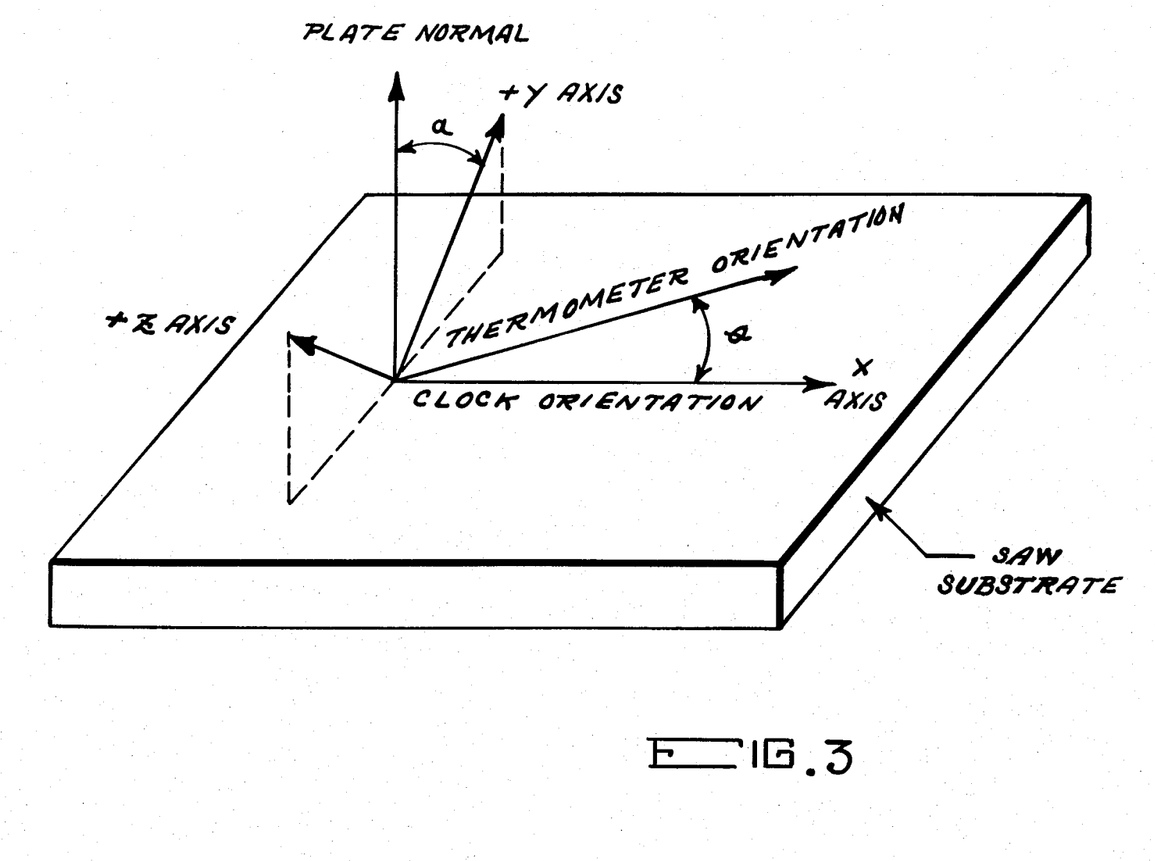
FIG. 3 is an example of a general SAW substrate for use in specifying crystal cuts.

It is expected that a large number of SAW substrates can be found which meet the above criteria. For example, a family of DCSO cuts exists for crystals described by FIG. 3 where $\alpha$ is a variable angle which allows choice of the clock frequency turnover temperature. For the purposes of illustration two particular substrates, ST quartz ($\alpha = 42.75°$) and AT quartz ($\alpha = 35.25°$), will be described in the context of their use as part of a DCSO device. Both ST quartz and AT quartz are, of course, well known for their inherent properties. Recall, however, the purpose of the DCSO is to reduce their inherent temperature sensitivities by using a second delay path as thermometer along with digital compensation.

Figure 4:
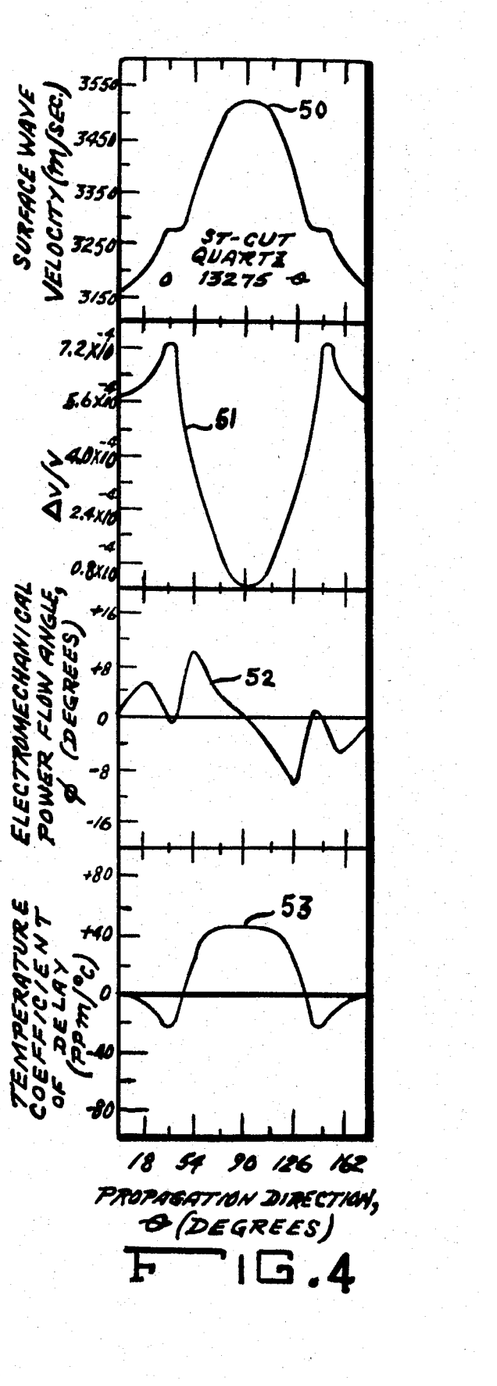
FIG. 4 is a graph illustrating SAW properties of ST cut quartz in the plane of the plate.

The surface acoustic wave properties in the plane of the ST plate are given graphically by curves 50-53 in FIG. 4. The ST clock orientation lies along the propagation direction corresponding to $\theta = 0°$ while the ST thermometer orientation corresponds to $\theta = 35.1°$. The corresponding angles for AT quartz (which is the substrate used for the examples given herein) are $\theta = 0°$ for the clock orientation and $\theta = 34.8°$ for the thermometer orientation. SAW properties of all four orientations are listed in Table 1 which gives a summary of the SAW properties of the two DCSO cuts.

TABLE I

| Type of Orientation | | Angle in Plane of Plate, $\theta$ | SAW Velocity $v_s$ (m/sec) | SAW Coupling Constant $k^2$ |
|---|---|---|---|---|
| ST quartz | Clock | 0° | 3158 | 0.0016 |
| $\alpha = 42.75$ | Thermometer | 35.1° | 3276 | 0.0018 |
| AT quartz | Clock | 0° | 3151 | 0.0016 |
| $\alpha = 35.25°$ | Thermometer | 34.8° | 3263 | 0.0019 |

The delay lines necessary to implement a DCSO device can be designed according to standard SAW oscillator techniques available in the literature. These techniques are briefly outlined here.

The frequency of oscillation, $f_o$, must satisfy the condition $$2N\pi = 2\pi f_o Z_o/v_s + \phi_E \tag{1}$$

where

N is an integer,
$Z_o$ is the transducer center-to-center separation,
$v_s$ is the SAW velocity and
$\phi_E$ is additional or external phase shift in the loop.

For the present theoretical purposes $\phi_E$ will be neglected; in practice, design procedures can minimize its effect or it can be experimentally biased out.

As equation (1) implies the existence of multiple tones (one for each value of N), a narrowband transducer is generally used to reject all but one mode of oscillation. To accomplish this goal the time length, $2\tau$, of the narrowband (assuming it is unapodized) transducer must be at least $$2\tau = Z_o/v_s. \tag{2}$$

Figure 5:
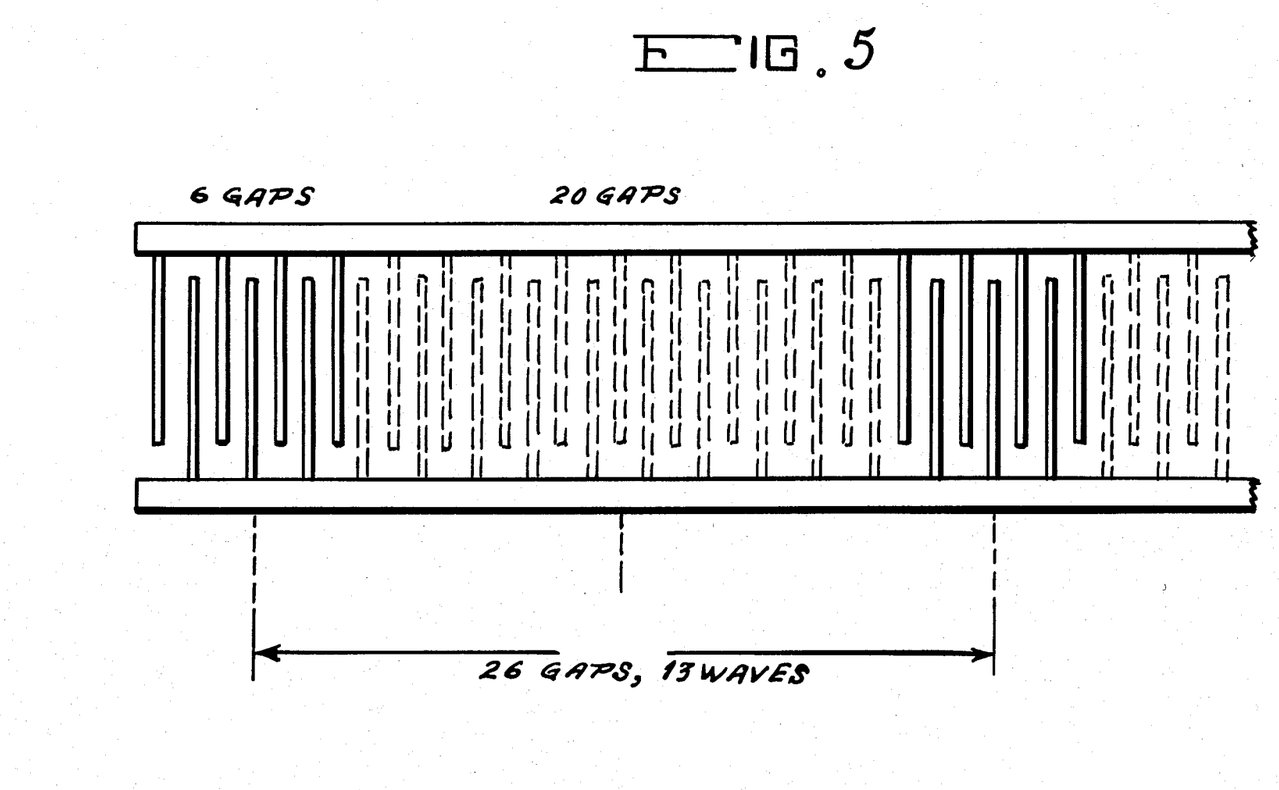
FIG. 5 is a schematic illustration of thinning used for long transducers.

The transducer separation $Z_o$ is generally chosen to yield a suitable $Q = \pi f_o Z_o/v_s$ subject to substrate size constraints and/or acoustic losses. By way of example, a value of $Q \approx 1500$ is deemed appropriate and a value of $Z_o = 15$ mm is chosen. For AT cut quartz having $v_s = 3151$ m/sec a minimum number of sampling units, $4f_o\tau$, for the narrowband transducer at $f_o = 100$ MHz becomes from equation (2), $4f_o\tau = 952$. This is a large number of sampling units which generally requires the use of a thinned transducer. In the present example thinning consisting of taps having 6 gaps separated by 20 missing gaps was chosen. This is shown schematically in FIG. 5. Using 37 taps results in an effective value of $4f_o\tau = 6(37) + 20(36) = 942$ which is sufficiently close to the present example design target of 952 so that it can be adopted.

Figure 6:
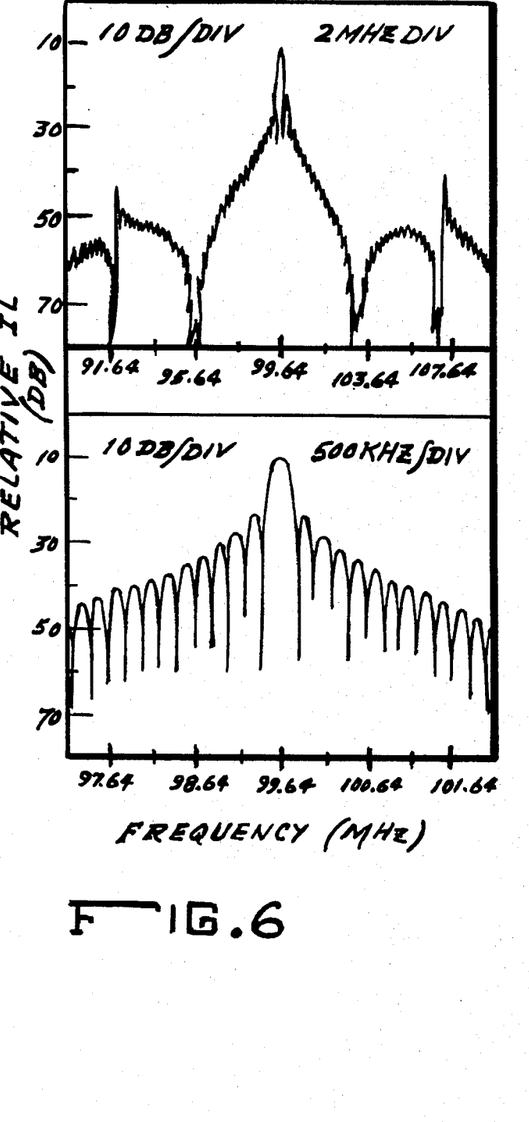
FIG. 6 is a graph illustrating theoretical insertion loss vs frequency characteristics of the clock delay line on AT quartz.
Figure 7:
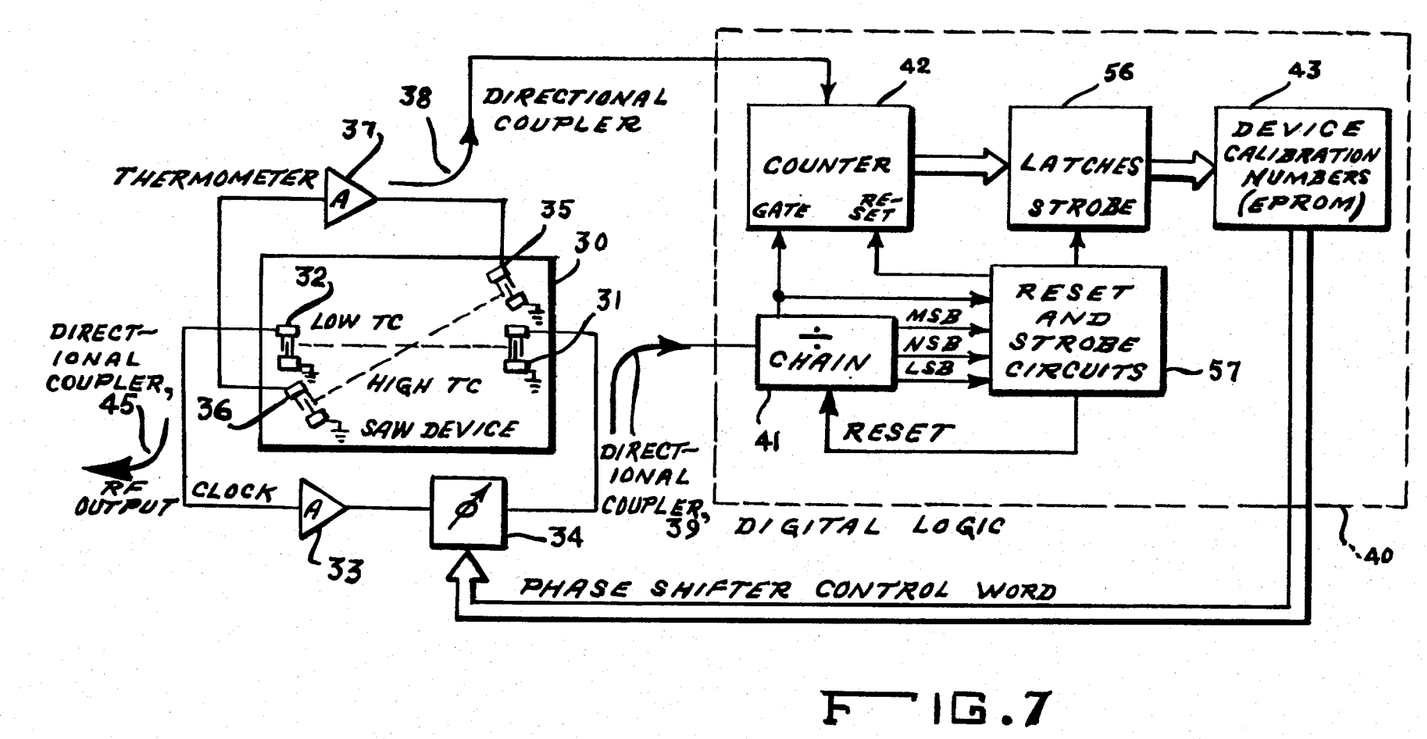
FIG. 7 is a detailed block diagram of the digitally compensated SAW oscillator in the operating mode.
Figure 8:
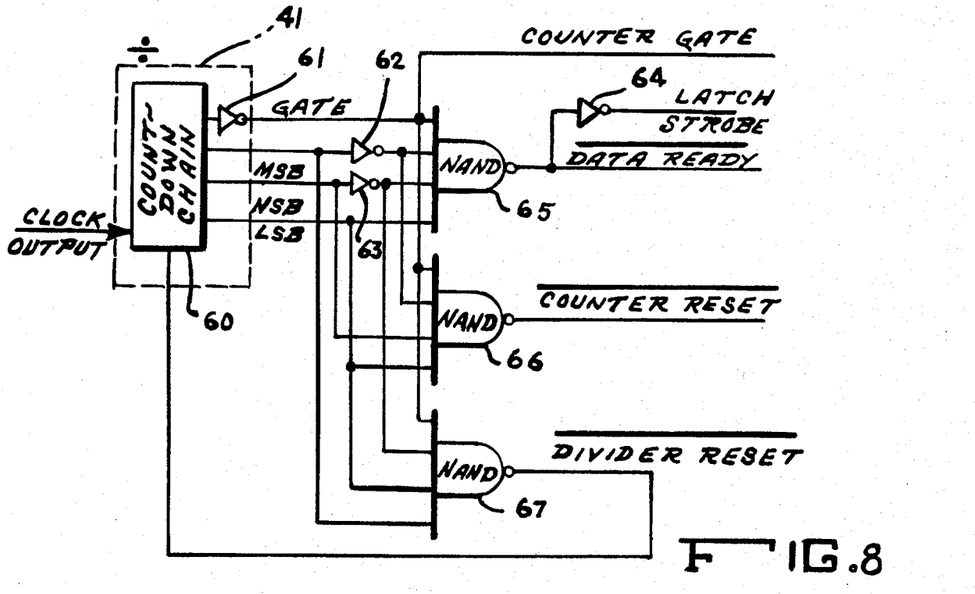
FIG. 8 is a schematic illustration of divider and reset and strobe circuitry.

Since a thinned transducer possess spurious passbands, the other transducer in each delay path should be designed to suppress these unwanted responses. This means placing nulls of the second transducer on the spurious passbands of the first. Since the thinned transducer passbands are separated in frequency by $$f_x = 2f_o/(\text{number of gaps between taps}), \tag{3}$$

the minimum time length $2\tau_s$, of the short transducers must be $$2\tau_s = 1/f_x = 13/f_o \tag{4}$$

or the minimum total number of gaps must be $4f_o\tau_s = 26$. In the present case a double length ($4f_o\tau_s = 52$ gaps) transducer can be adpoted for improved matching considerations. Identical pairs of transducers are used for both the clock and thermometer paths which, due to the differences in velocity, results in slightly different frequencies of oscillation. If for any reason it is desired to have the same oscillation frequencies, slightly different transducer pairs could, of course, be adopted. Double electrodes with line widths and gap spacings of 3.95 μm are used which places the clock frequency slightly below 100 MHz and the thermometer frequency slightly above 100 MHz. The acoustic aperture is 1175 μm. A theoretical frequency response curve corresponding to the clock path on AT quartz is illustrated in FIG. 6. This curve was generated using a second order effects SAW analysis program. A more complete description of the DCSO operating mode is shown in FIGS. 7 and 8. Here the simplified block diagram of FIG. 2 is upgraded to explicitly include the necessary latches as well as reset and strobe circuitry. Referring to FIG. 7, in addition to the elements shown in FIG. 2 there are included latches 56 and reset and strobe circuits 57. FIG. 8 illustrates the divider and reset and strobe circuitry. This circuitry comprises countdown chain 60, inverters 61-64 and NAND gates 65-67.

In order for the digitally compensated SAW oscillator (DCSO) to operate properly as illustrated in FIG. 7, the erasable programmable read only memory (EPROM) must first be calibrated. That is, for a given temperature or thermometer count applied to its input or address lines, the correct phase shifter control word must appear on its output or data lines.

Calibration is, of course, accomplished as a function of temperature with the SAW device placed in an oven. For the purposes of the present example only the SAW device itself is included in the oven. However, in practice the entire oscillator would be ovenized during calibration in order that temperature drift in the loop electronics would also be calibrated out.

Figure 9:
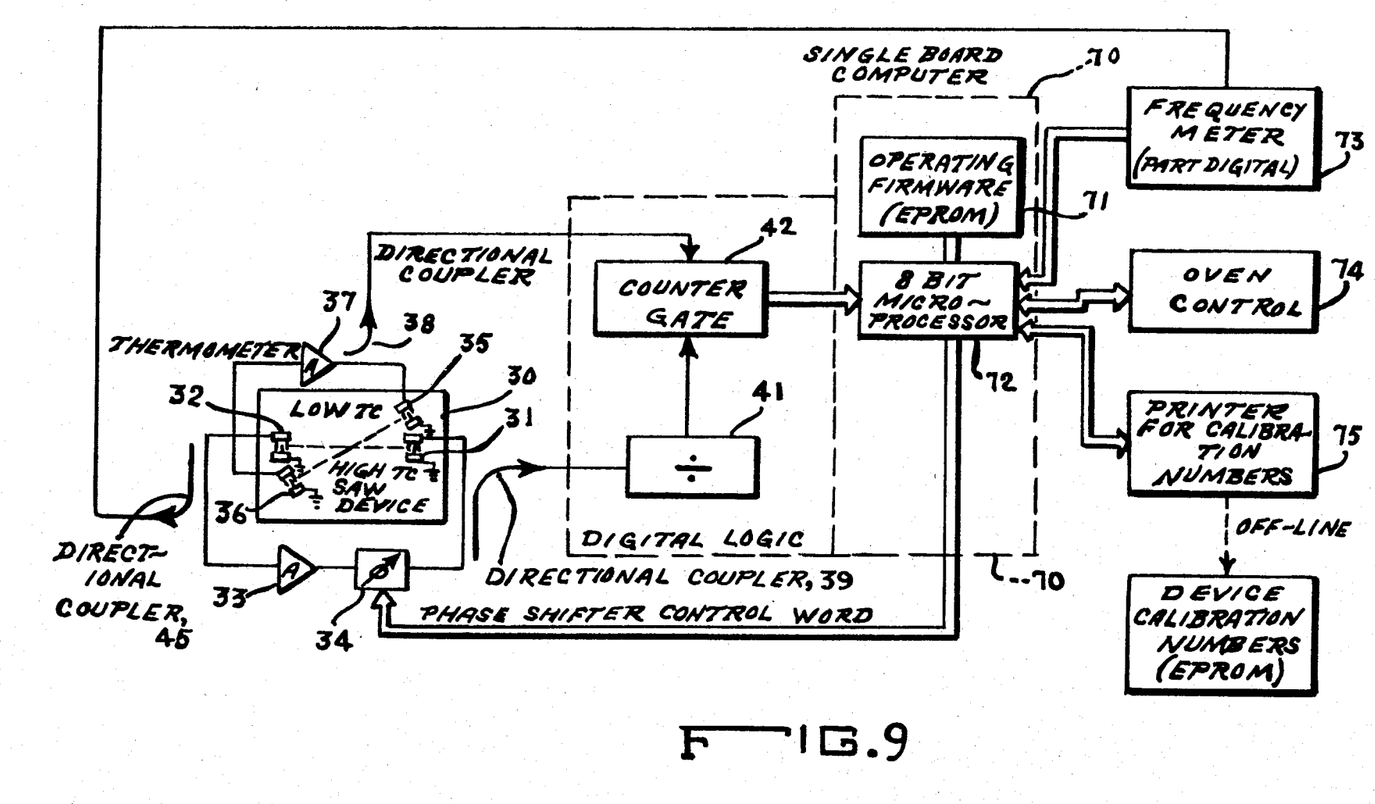
FIG. 9 is a simplified block diagram of the digitally compensated SAW oscillator in the calibration mode.

Actual calibration is accomplished as shown in FIG. 9. In addition to the components of FIG. 7 the arrangement of FIG. 9 includes single board computer 70 comprised of EPROM 71 and microprocessor 72, frequency meter 73, oven control 74 and printer 75. Details are as follows. The EPROM of FIG. 7 is temporarily replaced by a computer (in the present case, single board computer 70 based on the 8-bit microprocessor 72) which performs the calibration procedure. The computer varies the control word to the electronically variable phase shifter (either directly to a digital phase shifter or through a digital to analog converter to an analog phase shifter) and reads the clock frequency by means of the frequency meter 73. When the measured frequency equals the desired frequency, a calibration point is obtained and both the control word and corresponding thermometer count are printed out. It is not necessary to calibrate at each and every thermometer count as curve fitting techniques can be used on those points actually obtained in order to fill in the complete set. EPROM's are then programmed with the appropriate control word at each address (thermometer count). Although EPROM programming is currently accomplished off-line, in principle this function could also be accomplished by the computer.

In the operating mode the ability to maintain the desired frequency to a given precision over a specified temperature range is ultimately limited by EPROM size or the number of bits in the control word. Experimental results presented below used two 2716 erasable programmable read only memories to provide a 15-bit control word to a D to A converter at 2048 thermometer counts. If EPROM size is the limiting factor, frequency control precision can be exchanged for wider temperature coverage by reducing the count-down ratio of the thermometer counter.

Using the device designed and calibrated as discussed above, the complete DCSO system illustrated in FIG. 7 was implemented. The SAW device was ovenized and the temperature varied in the same manner as during the calibration run.

Figure 10:
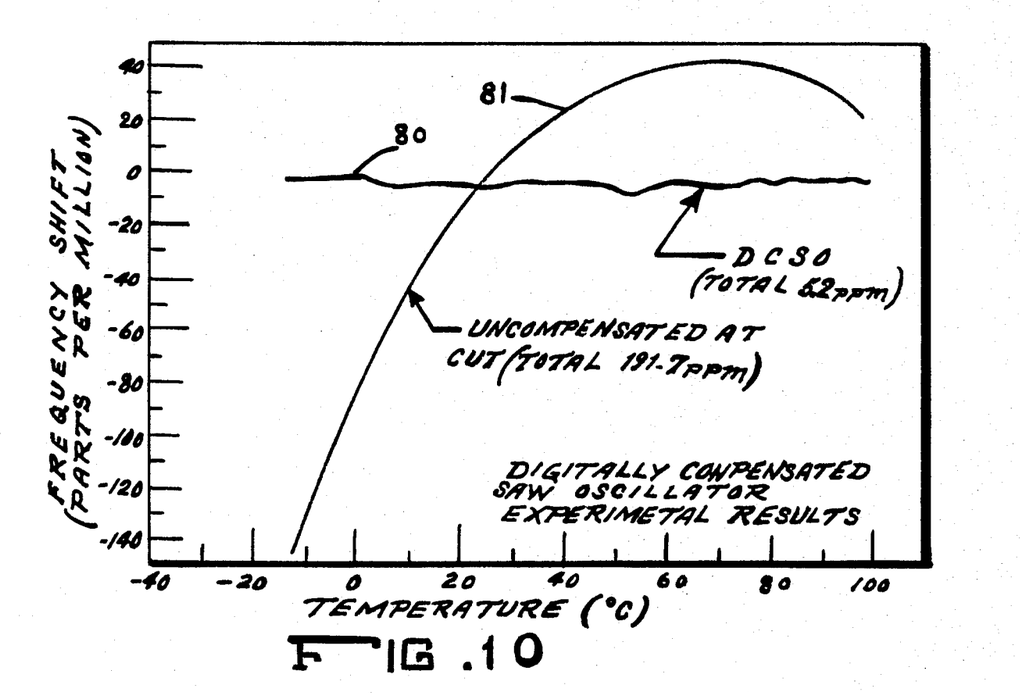
FIG. 10 is a graphical comparison of the temperature sensitivity of a digitally compensated SAW oscillator with that of an uncompensated AT cut SAW oscillator.

Experimental results are given in FIG. 10. A substantial improvement in frequency stability over the comparable uncompensated case is evident from curves 80 and 81. Since the results were obtained using an unsealed package in which low aging and thermal design considerations were not implemented, results are currently limited by a lack of reproducibility between the calibration and operating runs. Significant further reduction in temperature sensitivity can be expected when more advanced techniques are implemented.

Figure 11:
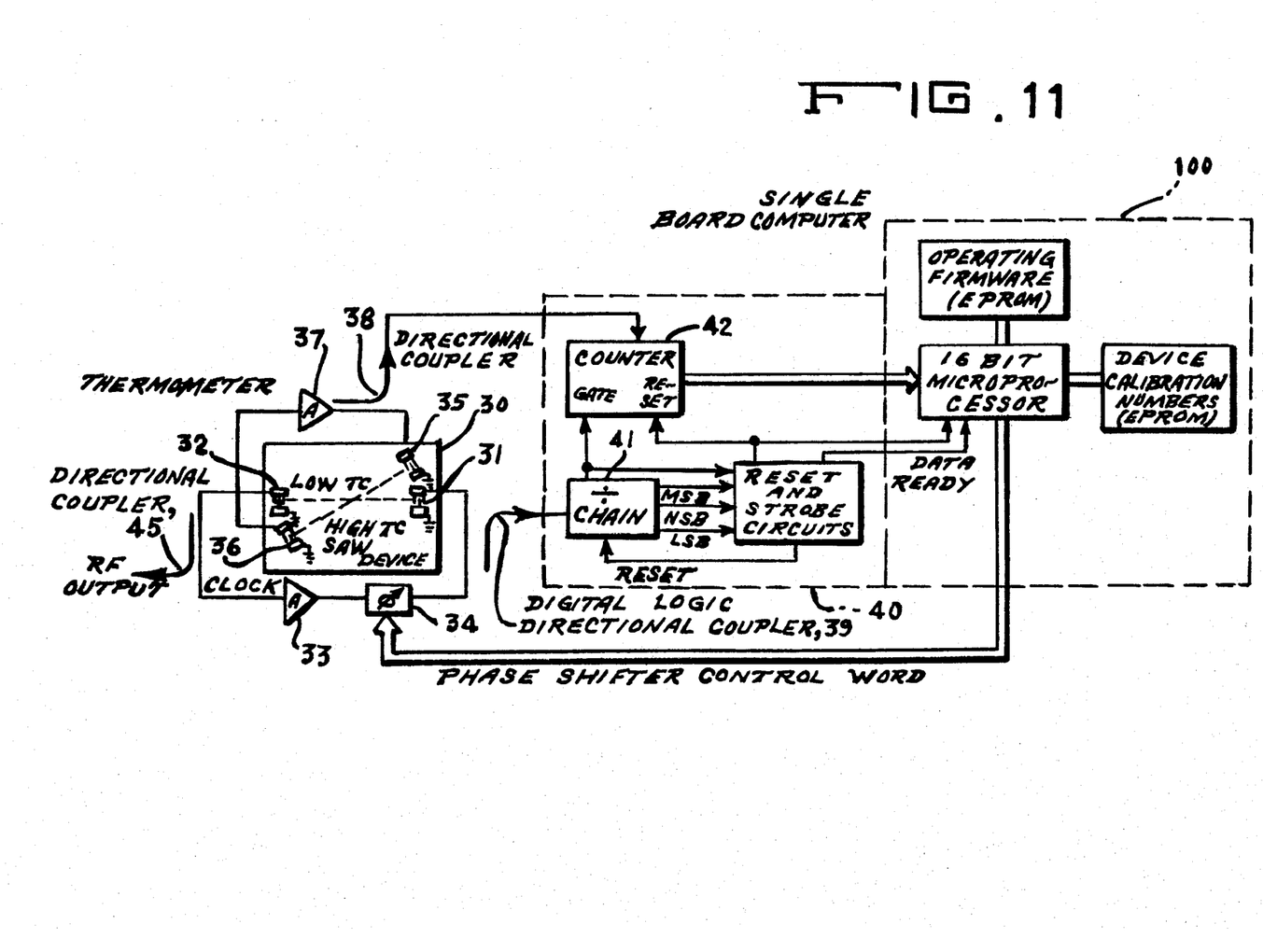
FIG. 11 is a block diagram of an advanced digitally compensated SAW oscillator in the operating mode.

A more advanced version of a digitally compensated SAW oscillator is shown in FIG. 11. Here, intelligence in the form of a microprocessor or computer 100 is incorporated. In addition to the previously described DCSO advantages of optimum temperature sensing, fast warmup, and low cost; several other important features now become possible. (1) Based on starting temperature and direction and rate of change of temperature, compensation for hysteresis and retrace effects can be accomplished. (2) Compensation for aging can be implemented if models for the dominant mechanisms can be developed. (3) Rapid back and forth frequency change due to last significant bit fluctuation can easily be eliminated. (4) Rapid temperature changes can be handled by outputting interpolated phase shifter control words between available thermometer counts. (5) Frequency tuning and frequency hopping while continuing to maintain low temperature sensitivity becomes possible. And, (6) curve fitting of fewer stored T-count, phase shifter data pairs will allow operation over a greater temperature range for a given EPROM size.

While the invention has been described in one presently preferred embodiment it is understood that the words which have been used as words of description rather than words of limitation and that changes within the purview of the appended claims may be made without departing from the scope and spirit of the invention in its broader aspect.

What is claimed is:

1. A frequency stable digitally compensated SAW oscillator comprising
    an acoustic wave device substrate having a SAW propagation surface,
    a first input-output transducer pair operably engaged to said SAW propagating surface and aligned to establish a clock ,ircuit delay path having a low substrate temperature coefficient of delay orientation,
    a first amplifier means connected between the input and output transducers of said first input-output transducer pair effecting a clock oscillator circuit,
    a frequency control means in said clock oscillator circuit,
    a second input-output transducer pair operably engaged to said SAW propagating surface and aligned to establish a thermometer circuit delay path having a high substrate temperature coefficient of delay orientation,
    a second amplifier means connected between the input and output transducer of said second input-output transducer pair effecting a thermometer oscillator circuit,
    means for coupling a clock oscillator signal from said clock oscillator circuit,
    means for coupling a thermometer oscillator signal from said thermometer oscillator circuit,
    a digital logic circuit receiving said clock oscillator signal and said thermometer oscillator signal and developing therefrom a temperature related frequency change compensation signal, and
    means feeding said frequency change compensation signal to said frequency control means.

2. A frequency stable digitally compensated SAW oscillator as defined in claim 1 wherein said clock circuit delay path has at least one zero temperature coefficient of delay within the oscillator's temperature range of interest.

3. A frequency stable digitally compensated SAW oscillator as defined in claim 2 wherein said clock circuit delay path and said thermometer circuit delay path intersect.

4. A frequency stable digitally compensated SAW oscillator as defined in claim 3 wherein said acoustic wave device substrate is fabricated of ST cut quartz.

5. A frequency stable digitally compensated SAW oscillator as defined in claim 4 wherein the substrate Y axis is at an angle $\alpha = 42.75°$ from the plate normal, said clock circuit delay path is at an angle $\theta = 0$ from the substrate X axis and said thermometer circuit delay line is at an angle $\theta = 35.1°$ from the substrate X axis.

6. A frequency stable digitally compensated SAW oscillator as defined in claim 3 wherein said acoustic wave device substrate is fabricated of AT cut quartz.

7. A frequency stable digitally compensated SAW oscillator as defined in claim 6 wherein the substrate Y axis is at an angle $\alpha = 35.25°$ from the plate normal, said clock circuit delay path is at an angle $\theta = 0$ from the substrate X axis and said thermometer circuit delay line is at an angle $\theta = 34.8°$ from the substrate X axis.

8. A frequency stable digitally compensated SAW oscillator as defined in claim 3 wherein said frequency control means comprises a phase shifter.

9. A frequency stable digitally compensated SAW oscillator as defined in claim 8 wherein said digital logic circuit includes
    a counter means controlled by said clock oscillator signal, said counter means receiving and counting the cycles of said thermometer oscillator signal, and
    memory means receiving thermometer oscillator signal counts from said counter means, said memory means being calibrated to provide a phase shifter control word for each thermometer oscillator signal count, said phase shifter control word constituting said frequency change compensation signal.

10. A frequency stable digitally compensated SAW oscillator as defined in claim 9 wherein said digital logic circuit includes
    latch means for holding the output of said counter means and subsequently supplying the output of said counter means to said memory means,
    gate means for gating said counter means,
    reset means for resetting said counter means,
    divider means receiving said clock oscillator signal, and
    a reset and strobe circuit receiving the output of said divider means and controlling said counter means, said latch means and said divider means.

11. A frequency stable digitally compensated SAW oscillator as defined in claim 10 wherein said reset and strobe circuit comprises
    a first inverter receiving an input from said divider means and providing a gate signal,
    a second inverter receiving a most significant bit signal from said divider means, a third inverter receiving a next significant bit signal from said divider means, a first NAND gate receiving said gate signal from said first inverter, an inverted most significant bit signal from said second inverter, an inverted next significant bit signal from said third inverter and a least significant bit signal from said divider means and outputting a data ready signal, a fourth inverter receiving said data ready signal and outputting a latch strobe signal, a second NAND gate receiving said gate signal from said first inverter, an inverted most significant bit signal from said second inverter, a next significant bit signal from said divider means, and a least significant bit signal from said divider means and outputting a counter reset signal, and a third NAND gate receiving said gate signal from said first inverter, an inverted next significant bit signal from said third inverter, a least significant bit signal from said divider means, and a most significant bit signal from said divider means and outputting a divider reset signal.

12. A frequency stable digitally compensated SAW oscillator as defined in claim 11 wherein said memory means comprises programmable read only memory.

13. A frequency stable digitally compensated SAW oscillator as defined in claim 11 wherein said memory means comprises erasable programmable read only memory.

14. A frequency stable digitally compensated SAW oscillator as defined in claim 11 including a microprocessor receiving inputs from said memory means, said counter means and said reset and strobe circuit and developing therefrom said frequency change compensation signal.

15. The method of fabricating a frequency stable digitally compensated SAW oscillator comprising the steps of providing an acoutic wave device substrate having a SAW propagation surface, affixing a first input-output transducer pair to said SAW propagating surface in an alignment that establishes a clock circuit delay path having a low substrate temperature coefficient of delay orientation, connecting a first amplifier means between the input and output transducer of said first input-output transducer pair to effect a clock oscillator circuit, inserting a phase shifter frequency control means into said clock oscillator circuit, affixing a second input-output transducer pair to said SAW propagating surface in an alignment that establishes a thermometer circuit delay path having a high substrate temperature coefficient of delay orientation, connecting a second amplifier means between the input and output transducer of said second input-output transducer pair to effect a thermometer oscillator circuit, providing a programmable memory means, calibrating said acoustic wave device substrate to establish calibration data in the form of phase shifter control words for temperature induced frequency changes in said substrate, programming said programmable memory means with said phase shifter control words, providing means for addressing said programmable memory means with thermometer oscillator circuit cycle counts, and providing means for controlling said phase shifter frequency control means with the phase shifter control words in said programmable memory means.

* * * * *